United States Patent [19]

Chew

[11] Patent Number: 5,085,321

[45] Date of Patent: Feb. 4, 1992

[54] CARRIER FOR AN INTEGRATED CIRCUIT PACKAGE

[75] Inventor: Hwee S. Chew, Singapore, Singapore

[73] Assignee: Microfits & Methods Pte. Ltd., Singapore, Singapore

[21] Appl. No.: 508,855

[22] Filed: Apr. 12, 1990

[30] Foreign Application Priority Data

Jun. 21, 1989 [GB] United Kingdom ............... 8914212

[51] Int. Cl.5 ............................................. B65D 85/42
[52] U.S. Cl. ..................................... 206/331; 206/328
[58] Field of Search ................................. 206/328-335

[56] References Cited

U.S. PATENT DOCUMENTS

| | | | |
|---|---|---|---|
| 3,409,861 | 11/1968 | Barnes et al. | 206/334 |
| 3,417,865 | 12/1968 | Suverkropp et al. | 206/331 |
| 3,604,557 | 9/1971 | Cedrone | 206/331 |
| 3,652,974 | 3/1972 | Tems | 206/331 |
| 4,379,505 | 4/1983 | Alemanni | 206/329 |
| 4,556,145 | 12/1985 | Putnam | 206/331 |
| 4,591,053 | 5/1986 | Alemanni | 206/334 |
| 4,690,275 | 9/1987 | Fritz | 206/331 |
| 4,760,917 | 8/1988 | Vitek | 206/334 |
| 4,881,639 | 11/1989 | Matsuoka et al. | 206/328 |

FOREIGN PATENT DOCUMENTS 2105289 3/1983 United Kingdom ............... 206/328

Primary Examiner—Jimmy G. Foster
Attorney, Agent, or Firm—Merchant, Gould, Smith, Edell, Welter & Schmidt

[57] ABSTRACT

A carrier for an integrated circuit package comprises an integral moulding of resilient plastics material and comprising end portions (4) formed on one surface with ribs (7) defining channels (8) for package leads, and interconnected by side wall portions (5) to define a window (9). The package is located on the carrier overlying the window by blending the carrier so that undercut grippers (11) are moved apart to allow the package to pass between them, whereafter the package is gripped when the carrier readopts its normal configuration.

2 Claims, 2 Drawing Sheets

CARRIER FOR AN INTEGRATED CIRCUIT PACKAGE

DESCRIPTION

The present invention relates to a carrier for an integrated circuit package, commonly referred to as a "flatpak". The carriers are used for supporting flatpaks during testing, marking, and conveyance and each has a window of appropriate size over which the package is supported, and, on one surface, a number of channels for accommodating and protecting respective ones of multiple leads projecting from the package.

Various types of carrier are known with different means for holding a package. For example, some involve springy catches, but these catches are inherently weak and frequently break. Others are made in two halves between which the package is sandwiched. However none is entirely satisfactory and it is an object of the invention to provide a carrier which is robust, but which can simply and securely locate a package in an appropriate alignment.

According to the present invention, a carrier for an integrated circuit package with projecting leads comprises a body having a window in alignment with which the package is arranged to be supported, a surface with channels extending away from the window for respective leads, and grippers at a pair of opposite edges of the window, the body being resiliently flexible to enable it to be bent so as to increase the spacing of the opposed grippers for introduction of a package, which is subsequently held in position by the grippers upon return of the body to its normal configuration.

The window is normally centrally disposed between parallel channels extending in opposite directions from the pair of opposed edges of the window. The body may then be bent to separate the grippers by mechanically providing opposite reactions, one on the two ends of the body and the other at a mid point of the body adjacent to the window.

The channels may be formed, in conventional fashion, between parallel ribs, and the ends of at least some of these ribs may form the grippers. The grippers may be undercut so as to overlie edges of the package.

The material from which the body is made, may have sufficient inherent resilience to enable the necessary bending. However, when the body has two channelled portions interconnected by side walls defining a second pair of opposite edges of the window, the side walls are preferably shaped to facilitate bending of the body at the side walls. By concentrating the bending of the body at the side walls, maximum separation of the grippers as a result of the flexing is achieved.

An example of a carrier constructed in accordance with the invention, and a comparison with the prior art, are illustrated in the accompanying drawings, in which.

Figure 1:
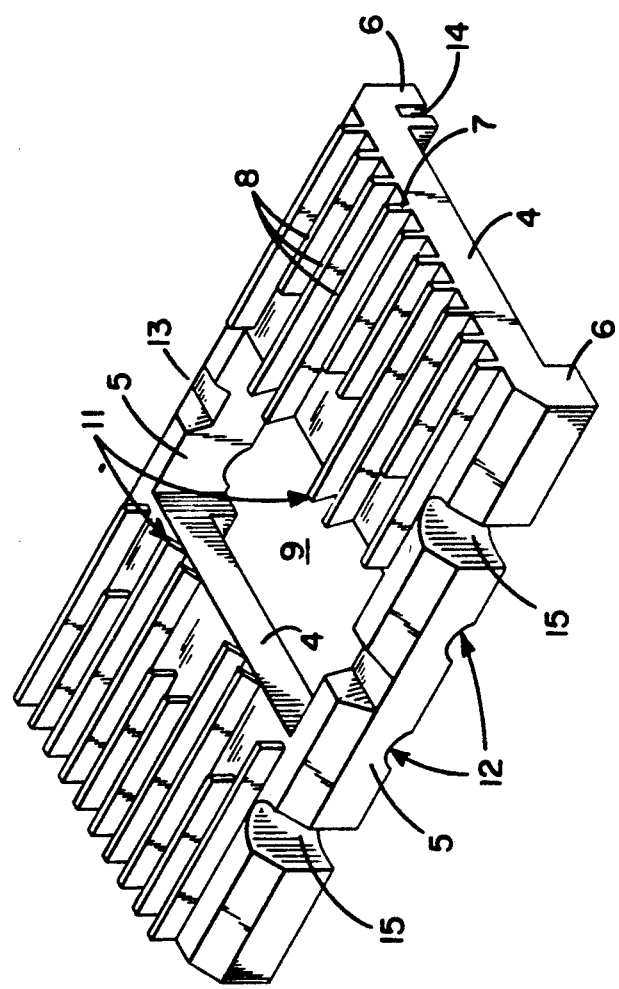
FIG. 1 is a perspective view of a carrier in accordance with the invention.
Figure 2:
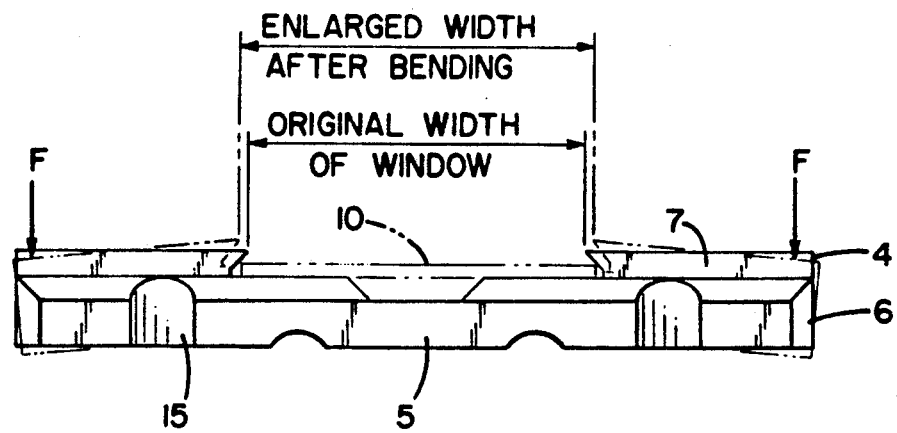
FIG. 2 is a diagrammatic side elevation of the carrier.

As shown in FIGS. 1 and 2, the carrier is an integral plastics moulding consisting of two co-planar plate like portions 4 interconnected by side wall portions 5 which continue as flanges 6 at the edges of the portions 4. The upper surface of the portions 1 are provided with a series of parallel upstanding ribs 7 which define, between adjacent pairs of the ribs, channels 8. The plate portions 4 and side wall portions 5 define a rectangular window 9 over which a potted integrated circuit of an IC package 10 is arranged to be located. Location is provided by some of the ribs 7 extending to, and having inclined undercut ends 11 projecting over opposite edges of, the window 9.

The plastics material from which the carrier is made is resiliently flexible and the side wall portions 5 are provided with recesses 12 at their underside, and a recess 13 at their top sides, whereby, when the central portion of the carrier is rested on a support, and forces F are applied downwardly to the ends of the carrier as shown in FIG. 2, the carrier bends from the full line position in FIG. 2 to the dash line position. As a result, the width or spacing between the opposed grippers 11 is enlarged, as shown in FIG. 2. A package can then be placed on the carrier between the grippers, and with the package leads lying in respective ones of the channels 8. If the forces F are then released, the carrier returns to its unflexed position and the grippers 11 move towards one another to overlie the edges of the package and hold it securely on the carrier.

Further recesses 14 and 15 are provided for location of the carrier. The package is prevented from passing through the window by the leads lying in the channels.

Figure 3:
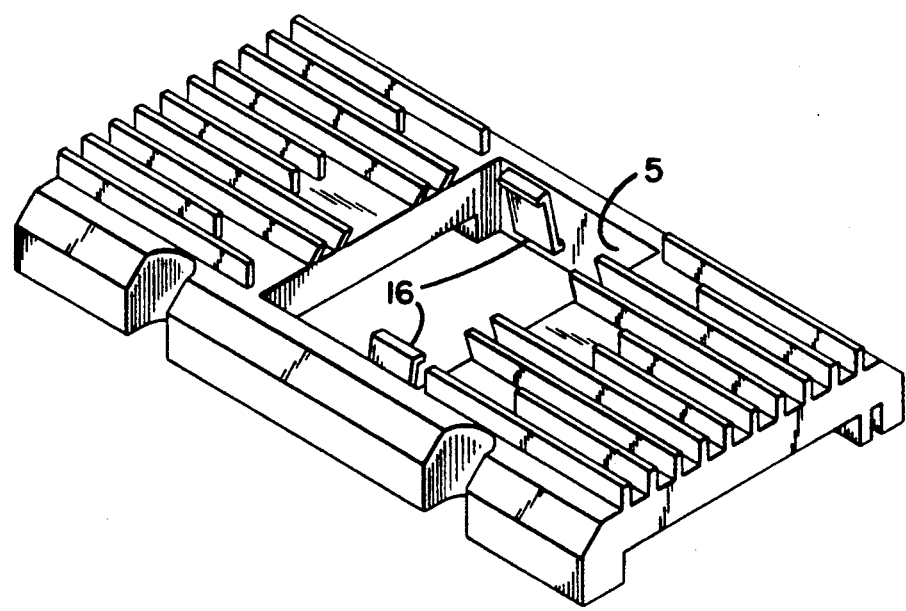
FIG. 3 is a perspective view similar to FIG. 1 but of a prior art carrier.

FIG. 3 shows, by way of comparison, a conventional carrier of similar construction, except that integral flexible catches 16 are provided on the inner surfaces of the wall portions 5 for snapping over and locating a package on the carrier.

I claim:

1. A carrier for an integrated circuit package with projecting leads, the carrier comprising a body having a window in alignment with which the package is arranged to be supported, a surface with channels extending away from the window for respective leads, side wall portions having a pair of recesses formed therein at their undersides and a recess formed at their top sides intermediate the recesses at their undersides, and grippers at a pair of opposite edges of the window, wherein the grippers are undercut, so as to overlie the package, the body being resiliently flexible to enable it to be bent so as to increase the spacing of the opposed grippers for introduction of a package which is subsequently held in position by the grippers upon return of the body to its normal configuration.

2. A carrier according to claim 1, in which the channels are provided between parallel ribs, the ends of some of which form the grippers.

* * * * *